United States Patent
You et al.

(10) Patent No.: US 9,040,993 B2
(45) Date of Patent: May 26, 2015

(54) ORGANIC LIGHT-EMITTING DISPLAY APPARATUS AND METHOD OF MANUFACTURING THE SAME

(71) Applicant: Samsung Display Co., Ltd., Yongin (KR)

(72) Inventors: Chun-Gi You, Yongin (KR); Joon-Hoo Choi, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 14/023,002

(22) Filed: Sep. 10, 2013

(65) Prior Publication Data
US 2014/0346448 A1 Nov. 27, 2014

(30) Foreign Application Priority Data
May 21, 2013 (KR) .................. 10-2013-0057297

(51) Int. Cl.
H01L 29/04 (2006.01)
H01L 33/00 (2010.01)
H01L 21/84 (2006.01)
H01L 51/52 (2006.01)
H01L 51/56 (2006.01)

(52) U.S. Cl.
CPC ............ H01L 51/5228 (2013.01); H01L 51/56 (2013.01)

(58) Field of Classification Search
USPC ................ 257/59, 72, E29.291, E33.053, 40; 438/149, 34
See application file for complete search history.

(56) References Cited

U.S. PATENT DOCUMENTS

| | | | |
|---|---|---|---|
| 7,915,811 B2 | 3/2011 | Kang et al. | |
| 2002/0180371 A1* | 12/2002 | Yamazaki et al. | 315/169.3 |
| 2004/0256620 A1* | 12/2004 | Yamazaki et al. | 257/66 |
| 2005/0057461 A1 | 3/2005 | Suh et al. | |
| 2005/0242348 A1* | 11/2005 | Oh | 257/59 |
| 2005/0253507 A1* | 11/2005 | Fujimura et al. | 313/506 |
| 2006/0019573 A1* | 1/2006 | Koo et al. | 445/24 |
| 2006/0113900 A1* | 6/2006 | Oh | 313/504 |
| 2006/0145606 A1* | 7/2006 | Lee | 313/509 |
| 2007/0132365 A1* | 6/2007 | Kang et al. | 313/500 |
| 2007/0170859 A1* | 7/2007 | Choi et al. | 313/512 |
| 2007/0241664 A1* | 10/2007 | Sakamoto et al. | 313/503 |
| 2008/0197778 A1* | 8/2008 | Kubota | 315/73 |
| 2010/0127264 A1* | 5/2010 | Bang et al. | 257/59 |
| 2011/0050604 A1 | 3/2011 | Kwon et al. | |
| 2012/0007083 A1* | 1/2012 | You et al. | 257/59 |

FOREIGN PATENT DOCUMENTS

| | | |
|---|---|---|
| KR | 10-0501313 | 7/2005 |
| KR | 10-0552963 | 2/2006 |
| KR | 10-2011-0024531 | 3/2011 |

* cited by examiner

*Primary Examiner* — Marvin Payen
*Assistant Examiner* — Jeremy Joy
(74) *Attorney, Agent, or Firm* — H.C. Park & Associates, PLC

(57) ABSTRACT

An organic light-emitting display apparatus and a method of manufacturing the same. The organic light-emitting display apparatus includes an organic light-emitting device in which a pixel electrode, an intermediate layer that includes an emissive layer, and a cathode electrode are sequentially stacked. The cathode contact unit includes a cathode bus line that is formed on the same layer as the pixel electrode and contacts the cathode electrode, a first auxiliary electrode that is formed on the cathode bus line along an edge area of the cathode bus line, and a second auxiliary electrode that contacts the first auxiliary electrode.

20 Claims, 12 Drawing Sheets

ORGANIC LIGHT-EMITTING DISPLAY APPARATUS AND METHOD OF MANUFACTURING THE SAME

CROSS-REFERENCE TO RELATED PATENT APPLICATION

This application claims priority from and the benefit of Korean Patent Application No. 10-2013-0057297, filed on May 21, 2013, which is hereby incorporated by reference for all purposes as if fully set forth herein.

BACKGROUND

1. Field

Exemplary embodiments of the present invention relate to an organic light-emitting display apparatus and a method of manufacturing the same.

2. Discussion of the Background

It is important to control heating with regard to a light-emitting display apparatus that employs a large amount of current.

A cathode electrode, which functions as a common electrode, applies the same voltage to all pixels and receives a cathode voltage from an external terminal via a cathode contact unit. The cathode contact unit has a structure in which a source/drain electrode-forming material, which is exposed to a pixel-defining layer, contacts a cathode electrode. Such a structure may result in poor contact between the source/drain electrode-forming material and the pixel-defining layer. Thus, heat may not be generated from the cathode contact unit, and may be concentrated on a periphery area of the cathode contact unit.

SUMMARY

One or more aspects of the present invention provide an organic light-emitting display apparatus for improving control of heat in a cathode contact unit.

Additional features of the invention will be set forth in the description which follows, and in part will be apparent from the description, or may be learned by practice of the invention An exemplary embodiment of the present invention discloses an organic light-emitting display apparatus including: an organic light-emitting device in which a pixel electrode, an intermediate layer including an emissive layer, and a cathode electrode are sequentially stacked; and a cathode contact unit including a cathode bus line which is formed on the same layer as the pixel electrode and contacts the cathode electrode, a first auxiliary electrode which is formed on the cathode bus line along an edge area of the cathode bus line, and a second auxiliary electrode which contacts the first auxiliary electrode.

An exemplary embodiment of the present invention also discloses a method of manufacturing an organic light-emitting display apparatus, the method including: forming a first electrode pattern for forming a pixel electrode; forming a second electrode pattern for forming a cathode bus line; forming an insulating layer including a hole exposing an upper surface of the first electrode pattern, and a plurality of contact holes exposing an upper surface of the second electrode pattern along an edge area of the second electrode pattern; forming the pixel electrode from the first electrode pattern; forming the cathode bus line and a first auxiliary electrode from the second electrode pattern; forming a second auxiliary electrode contacting the first auxiliary electrode via the plurality of contact holes; forming a pixel-defining layer exposing a part of the pixel electrode and the cathode bus line; and forming a cathode electrode on the pixel-defining layer in the form of a common electrode, the cathode electrode contacting the cathode bus line.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
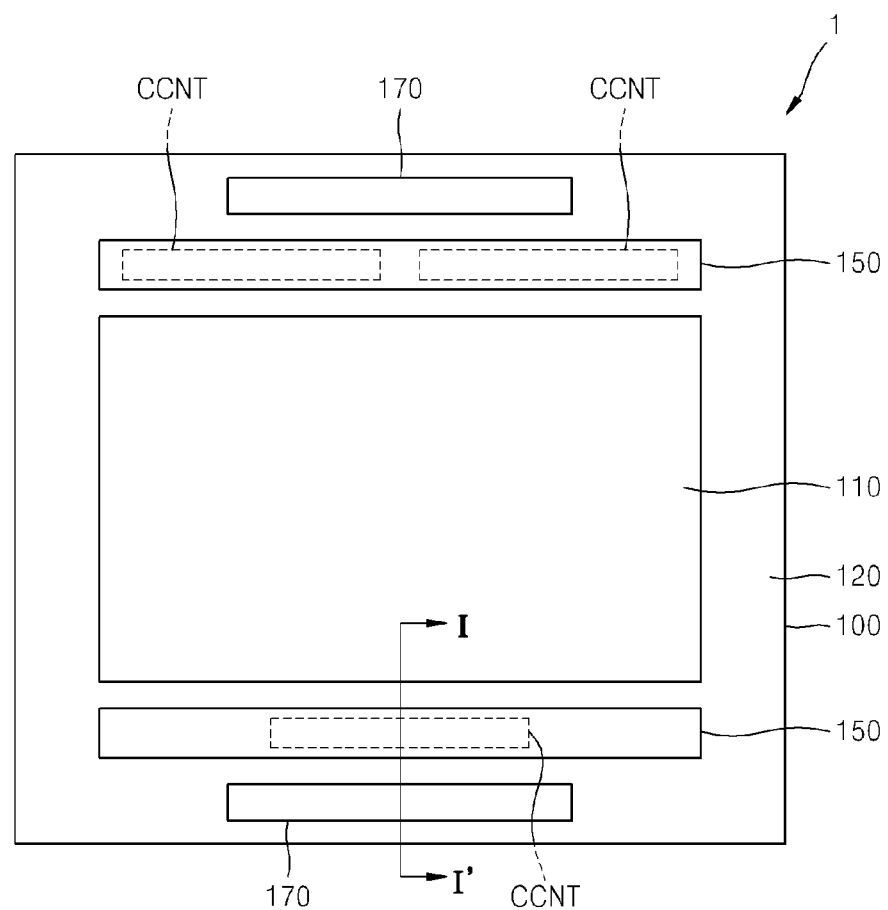
FIG. 1 is a schematic plan view illustrating a structure of an organic light-emitting display apparatus according to an exemplary embodiment of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers, regions, and other elements, including widths, lengths, thicknesses and the like, may be exaggerated for clarity. Like reference numerals in the drawings denote like elements.

While such terms as "first", "second", etc., may be used to describe various components, such components must not be limited to the above terms. The above terms are used only to distinguish one component from another.

The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "including" or "having", etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that when an element or layer is referred to as being "on" or "connected to" another element or layer, it can be directly on or directly connected to the other element or layer, or intervening elements or layers may be present. In contrast, when an element or layer is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

FIG. 1 is a schematic plan view illustrating a structure of an organic light-emitting display apparatus 1 according to an exemplary embodiment of the present invention.

The organic light-emitting display apparatus 1 includes a display area 110 in which pixels are arranged on a substrate 100, and a non-display area 120 that is formed outside of the display area 110.

The substrate 100 may be a low-temperature poly-crystalline silicon (LTPS) substrate, a glass substrate, or a plastic substrate.

In the display area 100, pixels, which are a basic unit of a displayed image, are arranged in the form of a matrix, and wirings, which are electrically connected to each pixel, are formed. A pixel may include a pixel circuit, which includes at least one thin-film transistor (TFT) and a capacitor Cst, and an organic light-emitting device EL. The organic light-emitting device EL has a pixel electrode connected to the TFT, on which are stacked an organic emissive layer and a cathode electrode in the form of a common electrode. A cathode voltage is applied to each pixel via the cathode electrode.

The non-display area 120 may include a cathode bus area 150 that is electrically connected to a cathode electrode in the display area 110 via a cathode contact unit CCNT, and pad areas 170 in which a pad PAD is formed. The pad PAD is used to apply power to the cathode bus area 150. The cathode bus area 150 applies a cathode voltage, which is applied from the outside via the cathode contact unit CCNT, to each pixel via the pad PAD. One or more cathode bus areas 150 and pad areas 170 may be formed on at least one side of the non-display area 120. FIG. 1 illustrates an example in which the cathode bus area 150 and the pad area 170 are respectively formed on upper and lower parts of the non-display area 120. However, the present invention is not limited thereto. For example, one or more cathode contact units CCNT may be formed in the cathode bus area 150.

According to an exemplary embodiment of the present invention, the cathode contact unit CCNT is formed in the non-display area 120, so that a cathode bus line and the cathode electrode are directly electrically connected to each other outside the display area 110. Thus, the cathode electrode and the cathode bus line are easily connected electrically to each other.

The substrate 100 may be bonded to an encapsulation substrate (not illustrated), which faces the substrate 100, by using a sealing member (not illustrated) formed on the non-display area 120.

Figure 2:
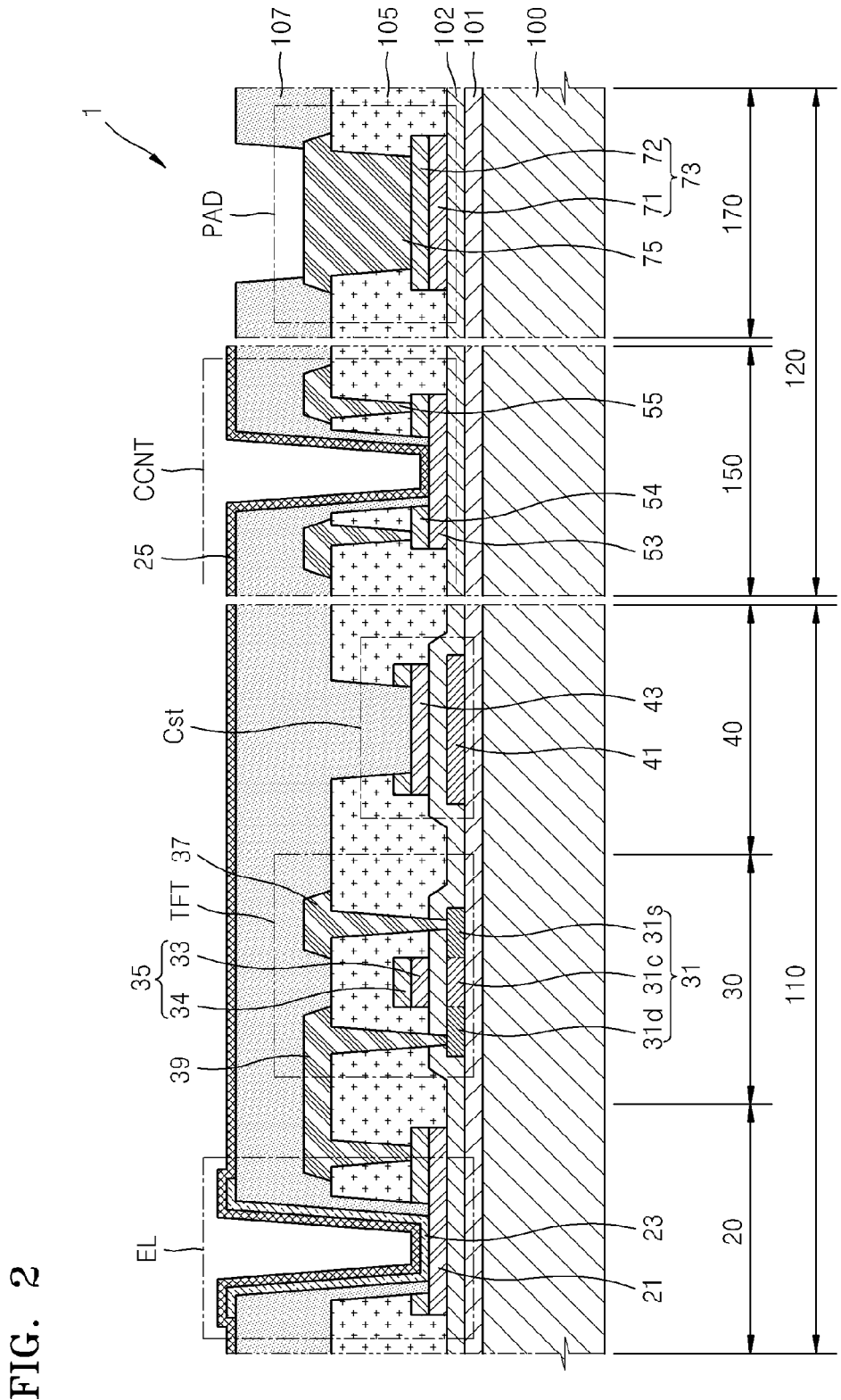
FIG. 2 is a cross-sectional view of the organic light-emitting display apparatus 1 taken along line I-I' of FIG. 1.

FIG. 2 is a cross-sectional view of the organic light-emitting display apparatus 1 taken along line I-I' of FIG. 1.

Referring to FIG. 2, the organic light-emitting display apparatus 1 includes a light-emitting area 20, a transistor area 30, and a storage area 40 in the display area 110, and the cathode bus area 150 and the pad area 170 in the non-display area 120.

The organic light-emitting device EL is included in the light-emitting area 20. The organic light-emitting device EL includes a pixel electrode 21 that is electrically connected to one of source/drain electrodes 37 and 39 of the TFT, a cathode electrode 25 formed to face the pixel electrode 21, and an intermediate layer 23 that is interposed between the pixel electrode 21 and the cathode electrode 25. The pixel electrode 21 is formed of a transparent conductive metal oxide and may be formed of the same material, and on the same layer, as a lower gate electrode 33 of the TFT.

The transistor area 30 includes the TFT as a driving device. The TFT includes an active layer 31, a gate electrode 35, and the source/drain electrodes 37 and 39. The gate electrode 35 includes the lower gate electrode 33 and an upper gate electrode 34 disposed on the lower gate electrode 33. The lower gate electrode 33 may be formed of a transparent conductive metal oxide. A first insulating layer 102, which is a gate insulating layer for insulating the gate electrode 35 from the active layer 31, is interposed between the gate electrode 35 and the active layer 31. Additionally, source/drain areas 31s and 31d, which are doped with a high-concentration of an impurity, are formed at both edges of the active layer 31. The source/drain areas 31s and 31d are respectively connected to the source/drain electrodes 37 and 39. An area between the source/drain areas 31s and 31d functions as a channel area 31c.

The storage area 40 includes a capacitor Cst. The capacitor Cst includes a lower capacitor electrode 41 and an upper capacitor electrode 43 with the first insulating layer 102 interposed therebetween. The lower capacitor electrode 41 may be formed on the same layer as the active layer 31 of the TFT. The lower capacitor electrode 41 is formed of a semiconductor material and is doped with an impurity to improve the electrical conductivity of the lower capacitor electrode 41. The upper capacitor electrode 43 may be formed on the same layer as the lower gate electrode 33 of the TFT and the pixel electrode 21 of the organic light-emitting device EL.

The cathode bus area 150 includes the cathode contact unit CCNT, in which a cathode bus line 53 and the cathode electrode 25 are electrically connected to each other. The cathode bus line 53 directly contacts, and thus is electrically connected to, the cathode electrode 25. A first auxiliary electrode 54, which directly contacts the cathode bus line 53 but does not directly contact the cathode electrode 25, is formed on an upper part of the edge area of the cathode bus line 53. A second auxiliary electrode 55, which directly contacts the first auxiliary electrode 54 but does not directly contact the cathode electrode 25, is formed on an upper part of the first auxiliary electrode 54. The first auxiliary electrode 54 contacts an edge area of the cathode bus line 53. Thus, the cathode electrode 25 contacts the second auxiliary electrode 55 via the first auxiliary electrode 54, as well as via the cathode bus line 53. The cathode bus line 53 may be formed on the same layer as the lower gate electrode 33 of the TFT, the pixel electrode 21 of the organic light-emitting device EL, and the upper capacitor electrode 43 of the capacitor Cst. The first auxiliary electrode 54 may be formed on the same layer as the upper gate electrode 34 of the TFT. The second auxiliary electrode 55 may be formed on the same layer as the source/drain electrodes 37 and 39 of the TFT.

The pad area 170 includes the pad PAD. Although not illustrated, the pad PAD may be electrically connected to the TFT or the organic light-emitting device EL via a wiring (not illustrated). Additionally, the pad PAD is electrically connected to a driver integrated circuit (IC) (not illustrated) that supplies a current for driving the organic light-emitting display apparatus 1. Accordingly, the pad PAD receives a current or a voltage from the driver IC and transmits the current or the voltage to the TFT or the organic light-emitting device EL which is located in the display area 110 via the wiring (not illustrated). The pad PAD transmits a cathode voltage to the cathode electrode 25 via the cathode contact unit CCNT in the cathode bus area 150. The pad PAD may include a lower pad electrode 73 and an upper pad electrode 75. The lower pad electrode 73 includes a first electrode 71 which is formed on the same layer as the lower gate electrode 33, and a second electrode 72 which is formed on the same layer as the upper gate electrode 34. The upper pad electrode 75 may be formed on the same layer as the source/drain electrodes 37 and 39 of the TFT. The upper pad electrode 75 is exposed to the outside via a hole, so as to be electrically connected to an external driving IC (not illustrated).

FIGS. 3 through 11 are schematic cross-sectional views illustrating a method of manufacturing the organic light-emitting display apparatus 1 of FIG. 2. Hereinafter, the method of manufacturing the organic light-emitting display apparatus 1 illustrated in FIG. 2 will be explained.

Figure 3:
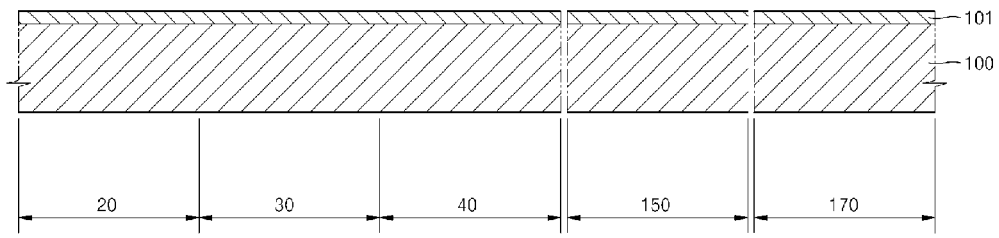
FIG. 3, FIG. 4, FIG. 5, FIG. 6, FIG. 7, FIG. 8, FIG. 9, FIG. 10, and FIG. 11 are schematic cross-sectional views illustrating a method of manufacturing the organic light-emitting display apparatus of FIG. 2, according to an exemplary embodiment of the present invention.

As illustrated in FIG. 3, an auxiliary layer 101 is formed on the substrate 100. Specifically, the substrate 100 may be formed of transparent glass having silicon dioxide ($SiO_2$) as a main component. However, the substrate 100 is not limited thereto, and may be formed of various materials, such as transparent plastic, metal, and the like.

The auxiliary layer 101, such as a barrier layer, a blocking layer, and/or a buffer layer, may be included on the substrate 100 to prevent the spread of impurity ions, prevent the inflow of moisture or external air, and planarize an upper surface of the substrate 100. The auxiliary layer 101 may be formed of $SiO_2$ and/or silicon nitride ($SiN_x$) by using various deposition methods, such as plasma-enhanced chemical vapor deposition (PECVD), atmospheric pressure chemical vapor deposition (APCVD), low pressure CVD (LPCVD), and the like.

Figure 4:
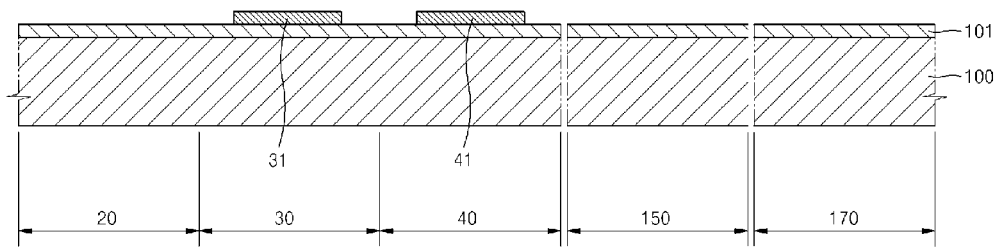

Then, as illustrated in FIG. 4, the active layer 31 of the TFT and the lower capacitor electrode 41 are formed on the auxiliary layer 11. The active layer 31 and the lower capacitor electrode 41 may be formed by patterning a polycrystalline silicon layer. The active layer 31 and the lower capacitor electrode 41 may include a semiconductor, and may include doped ion impurities. Additionally, the active layer 31 and the lower capacitor electrode 41 may be formed of an oxide semiconductor. In the current embodiment, the active layer 31 and the lower capacitor electrode 41 are formed to be separate from each other. However, the active layer 31 and the lower capacitor electrode 41 may be formed as one body.

Figure 5:
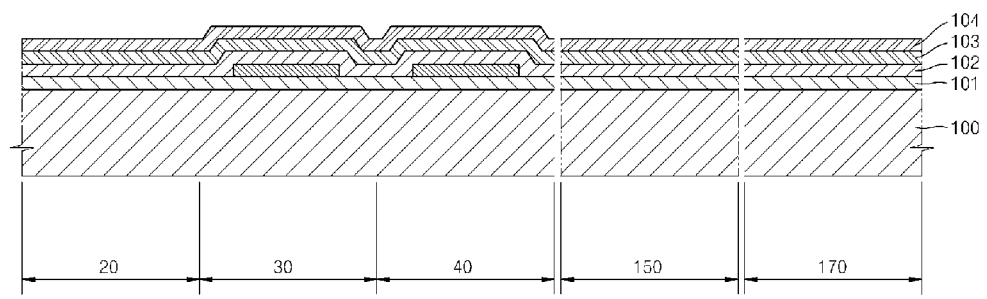

Then, as illustrated in FIG. 5, the first insulating layer 102, a first conductive layer 103, and a second conductive layer 104 are sequentially formed on an entire surface of the substrate 100 on which the active layer 31 and the lower capacitor electrode 41 are formed.

The first insulating layer 102 may be formed by depositing an inorganic insulating layer, such as $SiN_x$ or $SiO_x$, by using PECVD, APCVD, or LPCVD. The first insulating layer 102 is interposed between the active layer 31 and the gate electrode 35 of the TFT and functions as a gate insulating layer of the TFT. The first insulating layer 102 is also interposed between the upper capacitor electrode 43 and the lower capacitor electrode 41, and functions as a dielectric layer of the capacitor Cst.

The first conductive layer 103 may include at least one transparent conductive material, such as indium tin oxide (ITO), indium zinc oxide (IZO), zinc oxide (ZnO), and indium oxide ($In_2O_3$). The first conductive layer 103 may be patterned into the pixel electrode 21, the lower gate electrode 33, the upper capacitor electrode 43, the cathode bus line 53, and the first electrode 71 of the lower pad electrode 73.

The second conductive layer 104 may include at least one material selected from the group consisting of silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), molybdenum (Mo), titanium (Ti), tungsten (W), molybdenum tungsten (MoW), and copper (Cu). For example, the second conductive layer 104 may be formed of a three-layered structure that includes Mo—Al—Mo. Later, the second conductive layer 104 may be patterned into the upper gate electrode 34, the first auxiliary electrode 54, and the second electrode 72 of the lower pad electrode 73.

However, the present invention is not limited thereto. According to exemplary embodiments of the present invention, the first conductive layer 103 may include a material with a higher corrosion resistance than the second conductive layer 104. Additionally, the second conductive layer 104 may include a material which has a lower electrical resistance than the first conductive layer 103 to aid in current flow into the second conductive layer 104.

Figure 6:
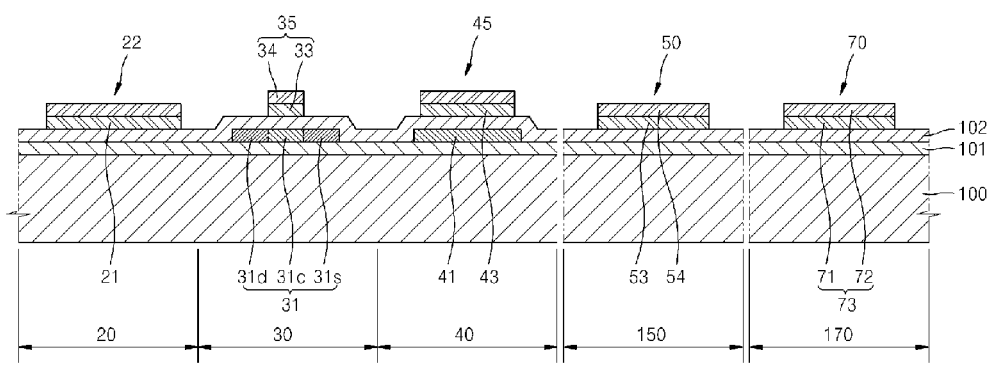

Then, as illustrated in FIG. 6, the first conductive layer 103 and the second conductive layer 104 are patterned, thereby respectively forming the gate electrode 35, a first electrode pattern 22, a second electrode pattern 45, a third electrode pattern 50, and a fourth electrode pattern 70 on a first substrate 100.

In the transistor area 30, the gate electrode 35 is formed on the active layer 31. The gate electrode 35 includes the lower gate electrode 33, which is formed from a part of the first conductive layer 103, and the upper gate electrode 34, which is formed from a part of the second conductive layer 104.

The gate electrode 35 is aligned with a center of the active layer 31. The active layer 21 is doped with an n-type or p-type impurity by using the gate electrode 35 as a self-aligned mask. By doing so, source/drain areas 31$s$ and 31$d$, and a channel area 31$c$, which is located between the source/drain areas 31$s$ and 31$d$, are formed at edges of the active layer 31 that correspond to both sides of the gate electrode 35. The impurity may be boron (B) ions or phosphorous (P) ions.

In the light-emitting area 20, the first electrode pattern 22 is formed, and is used later for forming the pixel electrode 21 later. In the storage area 40, the second electrode pattern 45, which is used later for forming the upper capacitor electrode 43, is formed on the lower capacitor electrode 41. Additionally, in the cathode bus area 150, the third electrode pattern 50, which is used later for forming the cathode bus line 53 and the first auxiliary electrode 54, is formed. In the pad area 170, the fourth electrode pattern 70, which is used later for forming the lower pad electrode 73 which includes the first electrode 71 and the second electrode 72 later.

Figure 7:
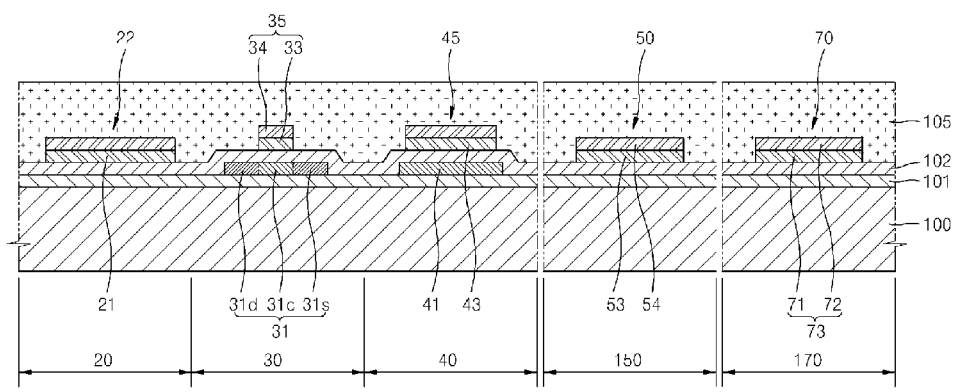

Then, as illustrated in FIG. 7, a second insulating layer 105 is deposited on an entire surface of the substrate 100 on which the gate electrode 35 is formed.

The second insulating layer 105 may be formed of an inorganic insulating material, as described above with regard to the first insulating layer 102. The second insulating layer 105 functions as an interlayer insulating layer between the gate electrode 35 of the TFT and the source/drain electrodes 37 and 39 of the TFT. The second insulating layer 105 may be formed by using at least one material selected from the group consisting of organic insulating materials, such as polyimide, polyamide, acryl resin, benzo-cyclo-butene (BCB), and phenolic resin, as well as the inorganic insulating material described above. The second insulating layer 105 may also be formed by alternating the organic insulating material and the inorganic insulating material.

Figure 8:
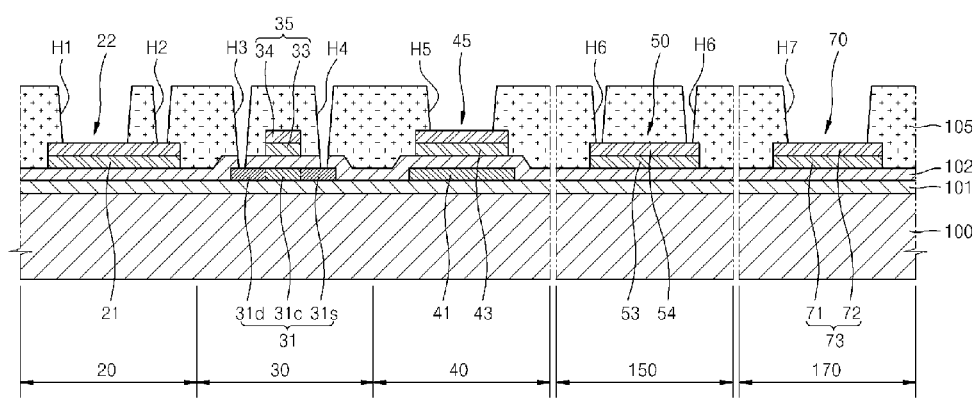

Then, as illustrated in FIG. 8, the second insulating layer 105 is patterned, so as to form first and second holes H1 and H2 exposing the first electrode pattern 22, a fifth hole H5 exposing the second electrode pattern 45, a seventh hole H7 exposing the fourth electrode pattern 70, contact holes H3 and H4 exposing portions of the source/drain areas 31s/31d of the active layer 31, and one or more contact holes H6 exposing an upper surface of the third electrode pattern 50 along an edge of the third electrode pattern 50.

The first hole H1 and the second hole H2 expose at least a part of the second conductive layer 104 that constitutes an upper part of the first electrode pattern 22. The contact holes H3 and H4 expose a part of the source/drain areas 31s and 31d, respectively. The fifth hole H5 exposes at least a part of the second conductive layer 104 that constitutes an upper part of the second electrode pattern 45. The contact holes H6 expose at least a part of the second conductive layer 104 that constitutes an upper part of the third electrode pattern 50. One or more contact holes H6 are formed in an edge area of the third electrode pattern 50. The seventh hole H7 exposes at least a part of the second conductive layer 104 that constitutes an upper part of the fourth electrode pattern 70.

Figure 9:
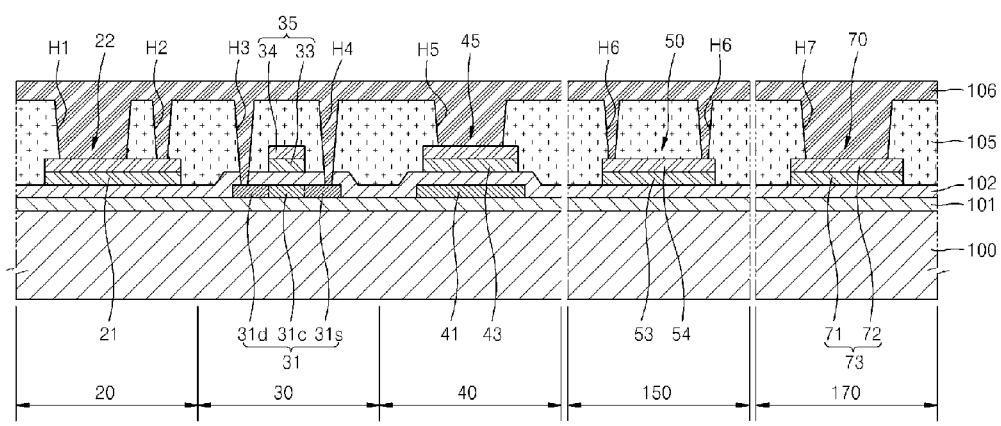

Then, as illustrated in FIG. 9, a third conductive layer 106 is deposited on an entire surface of the substrate 100 so as to cover the second insulating layer 105.

The third conductive layer 106 may be formed by using a material selected from among the same conductive materials as the first and second conductive layers 103 and 104. The third conductive layer 106 is not limited thereto, and may be formed of various conductive materials. The conductive materials are deposited with a sufficient thickness to fill the contact holes H3, H4, and H6, and the first, second, fifth, and seventh holes H1, H2, H5, and H7.

Figure 10:
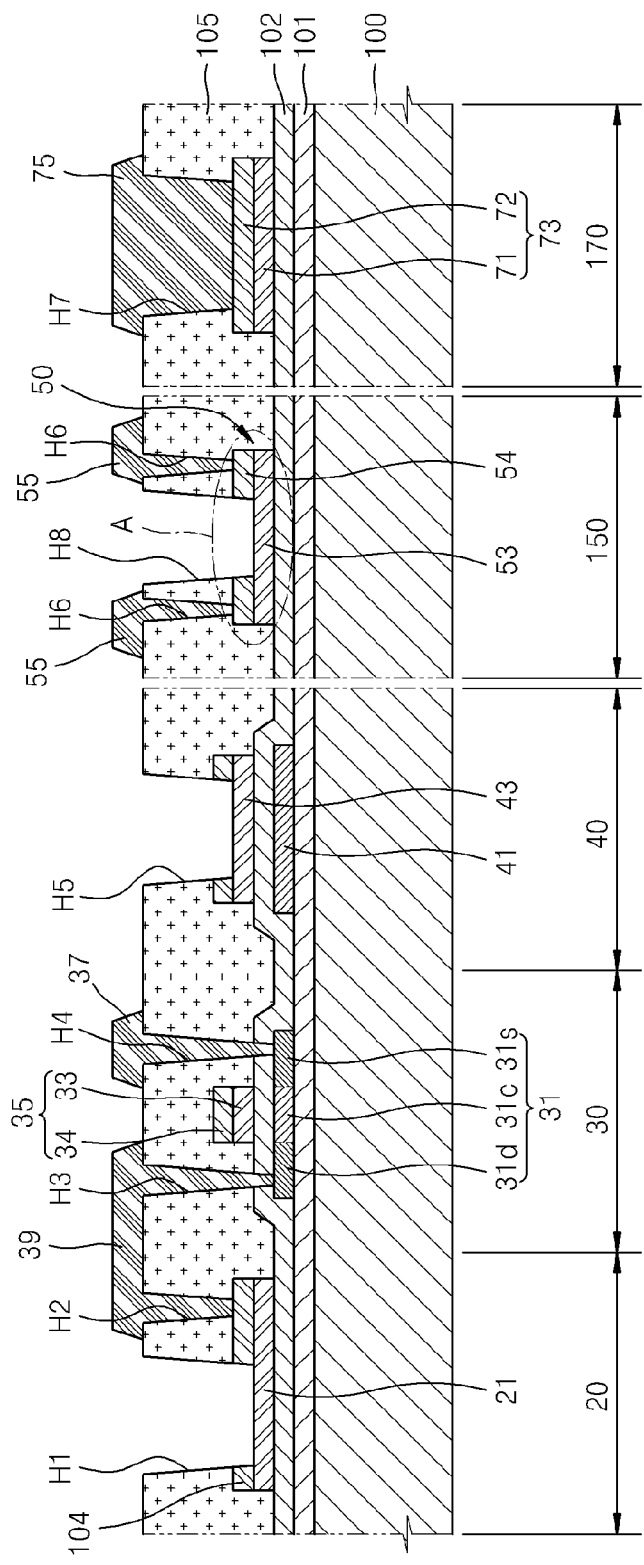

Then, as illustrated in FIG. 10, the third conductive layer 106 is patterned so as to form the source/drain electrodes 37 and 39, the second auxiliary electrode 55, and the upper pad electrode 75.

The source/drain electrodes 37 and 39 are electrically connected to the source/drain areas 31s and 31d of the active layer 31 via the contact holes H3 and H4. One of the source/drain electrodes 37 and 39, for example, the drain electrode 39 in the current exemplary embodiment, is formed to be electrically connected to the pixel electrode 21 via the second hole H2, which is formed with respect to an edge area of the second conductive layer 104 above the pixel electrode 21.

The second auxiliary electrode 55 is electrically connected to an edge area of the third electrode pattern 50 via the contact holes H6. Additionally, simultaneously with forming the second auxiliary electrode 55, the cathode bus line 53, and the first auxiliary electrode 54 are formed. However, the present invention is not limited thereto. The second auxiliary electrode 55 may be formed, and then, by performing additional etching, the cathode bus line 53 and the first auxiliary electrode 54 may be respectively formed.

Figure 14:
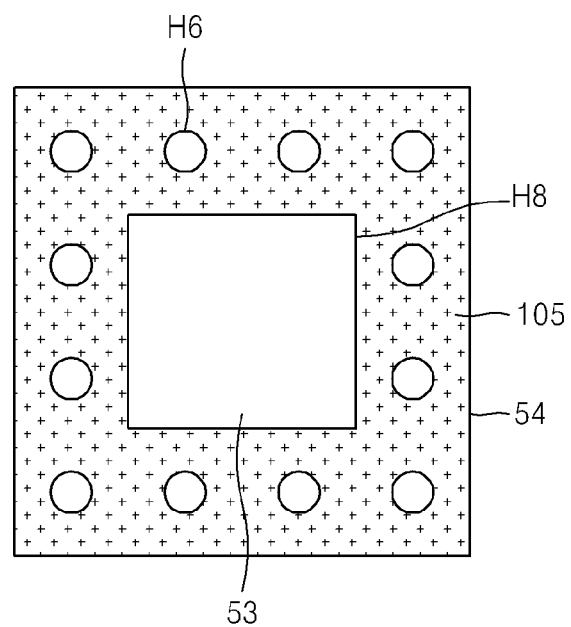
FIG. 14 is a diagram illustrating an area A of FIG. 10.

FIG. 14 is a diagram illustrating an area A of FIG. 10. Referring to FIG. 14, a part of the second conductive layer 104, included in the third electrode pattern 50 that is shown in FIG. 8, is removed, and thus, the cathode bus line 53 is formed by using the first conductive layer 103. An upper center surface of the cathode bus line 53 is exposed via a contact hole H8. The first auxiliary electrode 54 is formed by using the second conductive layer 104 that remains along an edge of the cathode bus line 53. The contact holes H6, which expose an upper surface of the first auxiliary electrode 54, are formed in the second insulating layer 105 on the first auxiliary electrode 54. The first auxiliary electrode 54 and the second auxiliary electrode 55 contact each other via the contact holes H6, and thus, are electrically connected to each other. Accordingly, the first auxiliary electrode 54 electrically connects the cathode bus line 53 to the second auxiliary electrode 55 via the contact holes H6.

According to an exemplary embodiment of the present invention, a plurality of the contact holes H6 is formed, so that electrical connection characteristics between the first auxiliary electrode 54 and the second auxiliary electrode 55 may be improved.

Referring back to FIG. 10, the upper pad electrode 75 directly contacts the second electrode 72 of the lower pad electrode 73 that is formed from the fourth electrode pattern 70 via the seventh electrode H7.

Simultaneously with forming the source/drain electrodes 37 and 39, the pixel electrode 21 and the upper capacitor electrode 43 are respectively formed. However, the present invention is not limited thereto. The source/drain electrodes 37 and 39 may be formed, and then, by performing additional etching, the pixel electrode 21 and the upper capacitor electrode 43 may be respectively formed. The pixel electrode 21 is formed by removing a part of the second conductive layer 104, which is exposed via the first hole H1, from the first electrode pattern 22 that is shown in FIG. 8. Additionally, the upper capacitor electrode 43 is formed by removing a part of the second conductive layer 104, which is exposed via the fifth hole H5, from the second electrode pattern 45 that is shown in FIG. 8.

Accordingly, the pixel electrode 21, the lower gate electrode 33, the upper capacitor electrode 43, the cathode bus line 53, and the first electrode 71 of the lower pad electrode 73 are formed of the same material and on the same layer. Additionally, the upper gate electrode 34, the first auxiliary electrode 54, and the second electrode 72 of the lower pad electrode 73 are formed of the same material and on the same layer.

The lower capacitor electrode 41 may be doped by injecting an n-type or p-type impurity through a hole that exposes an upper part of the upper capacitor electrode 43. The impurity injected for doping may be the same as or different from the impurity used for doping of the active layer 31.

Figure 11:
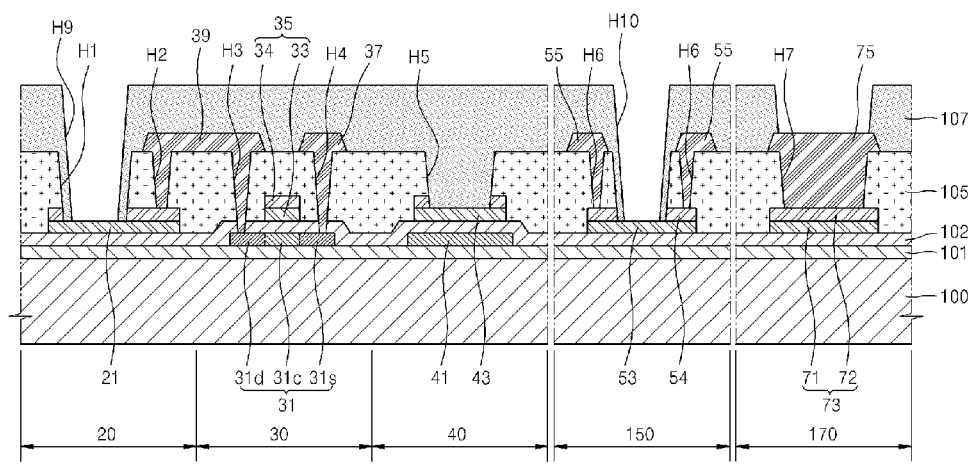

Then, as illustrated in FIG. 11, a third insulating layer 107 is formed on the substrate 100.

Specifically, the third insulating layer 107 is deposited on an entire surface of the substrate 100 on which the pixel electrode 21, the source/drain electrodes 37 and 39, the upper capacitor electrode 43, the cathode bus line 53, the second auxiliary electrode 55, and the upper pad electrode 75 are formed. The third insulating layer 107 may be formed by employing a spin coating method using at least one material selected from the group consisting of organic insulating materials, such as polyimide, polyamide, acryl resin, BCB, and phenolic resin. The third insulating layer 107 may also be formed by using an inorganic insulating material selected from the group consisting of $SiO_2$, SiNx, aluminum oxide ($Al_2O_3$), copper oxide (CuOx), terbium oxide ($Tb_4O_7$), yttrium ($Y_2O_3$), niobium oxide ($Nb_2O_5$), and praseodymium oxide ($Pr_2O_3$), as well as the organic insulating material. Additionally, the third insulating layer 107 may also be formed in a multiple-layered structure in which the organic insulating material and the inorganic insulating material are alternately used. The third insulating layer 107 may be optionally deposited on the pad area 170. By patterning the third insulating layer 107, a ninth hole H9 exposing a part of the pixel electrode 21, and a tenth hole H10 exposing a part of the cathode bus line 53, are formed. The third insulating layer 107 contacts an edge area of the pixel electrode 21 and the cathode bus line 53, and covers the first auxiliary electrode 54 and the second auxiliary electrode 55. That is, the edge area of the cathode bus line 53 is covered by the second insulating layer 105 and the third insulating layer 107. Accordingly, the first auxiliary electrode 54 and the second auxiliary electrode 55 do not directly contact the cathode electrode 25.

Then, as illustrated in FIG. 2, the intermediate layer 23, which includes an emissive layer (EML), and the cathode electrode 25 are formed in the hole H9 that exposes the pixel electrode 21.

The intermediate layer 23 may be formed by stacking the EML and one or more layers from among functional layers such as a hole transport layer (HTL), a hole injection layer (HIL), an electron transport layer (ETL), and an electron injection layer (EIL) to form a structure of single or multiple layers. The EML may include a low-molecular weight organic material or a polymer organic material. If the EML emits red light, green light, or blue light, the EML may be patterned as a red light EML, a green light EML, or a blue light EML, respectively. If the EML emits white light, the EML may have a multi-layered structure that includes a red light EML, a green light EML, and a blue light EML, or may have a single-layered structure that includes a red light-emitting material, a green light-emitting material, and a blue light-emitting material, so as to emit white light.

The cathode electrode 25 may be deposited on an entire surface of the substrate 100, other than the pad area 170, as a common electrode. The cathode electrode 25 directly contacts the cathode bus line 53 via the contact hole H10 in the cathode contact unit CCNT.

When the organic light-emitting display apparatus 1 is a bottom-emission type display apparatus which displays an image in a direction towards the substrate 100, the pixel electrode 21 may be a transparent electrode, and the cathode electrode 25 may be a reflective electrode. The reflective electrode may be formed by thinly depositing metal having a low work function, for example, Ag, Mg, Al, Pt, Pd, Au, Ni, Nd, Ir, Cr, Li, Ca, LiF/Ca, LiF/Al, or a combination thereof.

Figure 12:
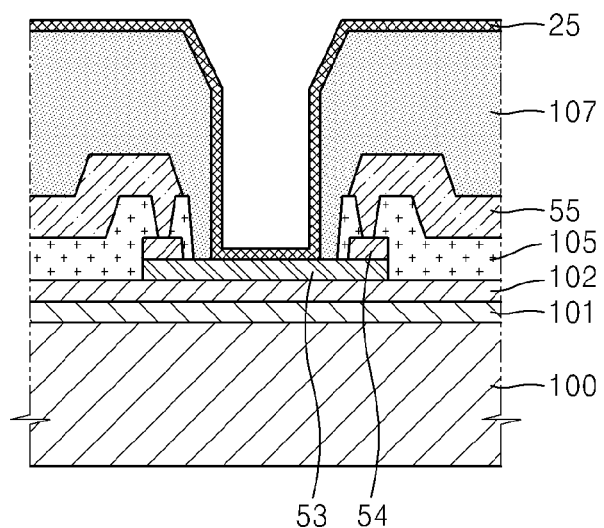
FIG. 12 is a cross-sectional view illustrating a cathode contact unit according to an exemplary embodiment of the present invention.
Figure 13:
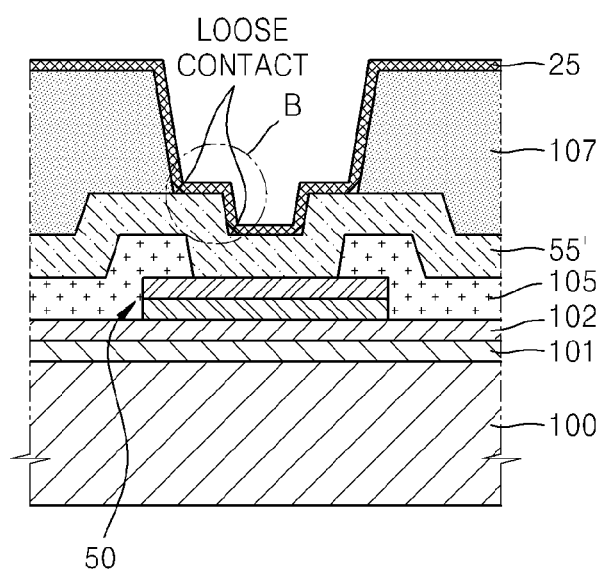
FIG. 13 is a schematic cross-sectional view illustrating a comparative example of the cathode contact unit of FIG. 12.

FIG. 12 is a cross-sectional view illustrating the cathode contact unit CCNT according to an exemplary embodiment of the present invention. FIG. 13 is a schematic cross-sectional view illustrating a comparative example of the cathode contact unit CCNT of FIG. 12

Referring to the cathode contact unit CCNT according to the comparative example shown in FIG. 13, the third electrode pattern 50, which is shown in FIG. 8 and formed on the substrate 100 on which the auxiliary layer 101 and the first insulating layer 102 are sequentially stacked, is included without having to perform additional patterning. The second insulating layer 105 is stacked on the third electrode pattern 50, shown in FIG. 8, and an upper surface of the third electrode pattern 50, shown in FIG. 8, is exposed via a hole that is formed in the second insulating layer 105. The third electrode pattern 50, shown in FIG. 8, is formed by using the first conductive layer 103, which includes a pixel electrode-forming material, and the second conductive layer 104, which includes a gate electrode-forming material. On the second insulating layer 105, an electrode layer 55', which is formed by using the third conductive layer 106, contacts the third electrode pattern 50 shown in FIG. 8. The third conductive layer 106 includes a source/drain electrode-forming material.

The third insulating layer 107 is formed as a pixel-defining layer on the electrode layer 55'. An upper surface of the electrode layer 55' is exposed via a hole that is formed in the third insulating layer 107. On the third insulating layer 107, the cathode electrode 25 is formed as a common electrode and contacts and thus is electrically connected to an exposed upper surface of the electrode layer 55'.

That is, with regard to the cathode contact unit CCNT in the comparative example, the cathode electrode 25 contacts the electrode layer 55', which is formed of a source/drain electrode-forming material, and the third insulating layer 107 contacts the electrode layer 55', which is formed of a source/drain electrode-forming material. In this case, a lifting phenomenon occurs in the third insulating layer 107 in a step area B as a result of poor contact between the third insulating layer 107, which includes an organic insulating material, and a source/drain electrode-forming material. Particularly, if the source/drain electrode-forming material includes Mo, poor contact (loose-contact) between the electrode layer 55', which is formed of a source/drain electrode-forming material, and the third insulating layer 107 may worsen as a result of oxidation of Mo. Accordingly, a deviation in contact resistance arises between the electrode layer 55', which is formed of a source/drain electrode-forming material, and the cathode electrode 25. Additionally, heat is not generated from a loose-contact part (a lifting part) of the third insulating layer 107. A current concentration phenomenon is generated and, thus, heat generation is concentrated in a periphery area.

In contrast, according to an exemplary embodiment of the present invention shown in FIG. 12, in the cathode contact unit CCNT, the cathode electrode 25 directly contacts the cathode bus line 53 that includes a pixel electrode-forming material, instead of contacting an electrode layer that includes a source/drain electrode-forming material. Additionally, a pixel-defining layer as the third insulating layer 107 covers the first auxiliary electrode 54, which includes a gate electrode-forming material, and the second auxiliary electrode 55, which includes a source/drain electrode-forming material, and contacts an upper edge of the cathode bus line 53. Accordingly, electrical contact of the third insulating layer 107 may be improved, and a resultant poor resistance distribution between the cathode electrode 25 and the lower electrode layer may be reduced.

A transparent conductive metal oxide, which is a pixel electrode-forming material that forms the cathode bus line 53, has a relatively high electrical resistance. Accordingly, a driving voltage and power consumption of an organic light-emitting display apparatus may be increased. According to an exemplary embodiment of the present invention, the first auxiliary electrode 54 and the second auxiliary electrode 55, which have a relatively low electrical resistance, contact the cathode bus line 53. Thus, an electrical resistance of the cathode bus line 53 may be reduced. That is, because the first auxiliary electrode 54 and the second auxiliary electrode 55, which have a relatively low electrical resistance, are formed on the cathode bus line 53, an overall electrical resistance of the cathode bus line 53 is reduced. Accordingly, a voltage drop of the cathode electrode 25, which contacts the cathode bus line 53, is reduced, and power loss that may be caused by an electrical resistance is minimized. Therefore, the brightness of an organic light-emitting device may be increased, brightness uniformity may be improved, and power consumption may be reduced under the same driving voltage. Thus, an organic light-emitting display apparatus may be large and may have a high resolution. Additionally, product quality may be improved.

According to the present invention, a cathode bus line, which contacts a cathode electrode, is formed of a pixel electrode-forming material. Thus, a loose-contact phenomenon of a pixel-defining layer in the cathode contact unit may be prevented and a deviation in heat generation may be reduced. Accordingly, a display apparatus may be easily made large and a high-quality image may be easily provided.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic light-emitting display apparatus, comprising:
   an organic light-emitting device comprising a pixel electrode, a cathode electrode, and an intermediate layer disposed between the pixel electrode and the cathode electrode; and
   a cathode contact unit comprising:
      a cathode bus line disposed on the same layer as the pixel electrode and contacting the cathode electrode;
      a first auxiliary electrode disposed along edge areas excluding a center area of the cathode bus line; and
      a second auxiliary electrode contacting the first auxiliary electrode.

2. The organic light-emitting display apparatus of claim 1, further comprising:
   an insulating layer disposed between the cathode bus line and the first auxiliary electrode and the second auxiliary electrode; and
   a pixel-defining layer disposed on the insulating layer, the pixel-defining layer contacting the pixel electrode and an edge area of the cathode bus line.

3. The organic light-emitting display apparatus of claim 2, wherein the pixel-defining layer covers the first auxiliary electrode and the second auxiliary electrode, and contacts the edge area of the cathode bus line.

4. The organic light-emitting display apparatus of claim 2, wherein the second auxiliary electrode contacts the first auxiliary electrode via contact holes formed in the insulating layer.

5. The organic light-emitting display apparatus of claim 1,
   wherein the pixel electrode and the cathode bus line comprise a transparent conductive metal oxide, and
   wherein the first auxiliary electrode and the second auxiliary electrode comprise at least one material selected from the group consisting of silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), molybdenum (Mo), titanium (Ti), tungsten (W), molybdenum tungsten (MoW), and copper (Cu).

6. The organic light-emitting display apparatus of claim 1, wherein the first auxiliary electrode and the second auxiliary electrode comprise a material having a lower electrical resistance than the cathode bus line.

7. The organic light-emitting display apparatus of claim 1, wherein the cathode contact unit is disposed in a non-display area of the organic light-emitting display apparatus.

8. The organic light-emitting display apparatus of claim 2, wherein the cathode electrode is disposed on the pixel-defining layer and is configured to operate as a common electrode, and does not directly contact the first auxiliary electrode and the second auxiliary electrode.

9. The organic light-emitting display apparatus of claim 2, wherein the insulating layer comprises an inorganic insulating material.

10. The organic light-emitting display apparatus of claim 2, wherein the pixel-defining layer comprises an organic insulating material.

11. The organic light-emitting display apparatus of claim 1, further comprising a thin-film transistor (TFT), the TFT comprising:
    an active layer;
    a gate electrode comprising a lower gate electrode disposed on the same layer as the cathode bus line and an upper gate electrode disposed on the same layer as the first auxiliary electrode; and
    a source electrode and a drain electrode that are both disposed on the same layer as the second auxiliary electrode and contact the active layer.

12. The organic light-emitting display apparatus of claim 11, further comprising a capacitor comprising:
    a lower capacitor electrode disposed on the same layer as the active layer; and
    an upper capacitor electrode disposed on the same layer as the cathode bus line.

13. The organic light-emitting display apparatus of claim 1, further comprising a pad comprising:
    a lower pad electrode comprising a first electrode layer disposed on the same layer as the cathode bus line and a second electrode layer disposed on the same layer as the first auxiliary electrode; and
    an upper pad electrode disposed on the same layer as the second auxiliary electrode and that contacts the lower pad electrode.

14. A method of manufacturing an organic light-emitting display apparatus, the method comprising:
    forming a first electrode pattern on a substrate;
    forming a second electrode pattern on the substrate;
    forming an insulating layer on the substrate, the insulating layer comprising a hole exposing an upper surface of the first electrode pattern and contact holes exposing an upper surface of the second electrode pattern along an edge area of the second electrode pattern;
    forming the pixel electrode from the first electrode pattern;
    forming a cathode bus line and a first auxiliary electrode from the second electrode pattern;
    forming a second auxiliary electrode contacting the first auxiliary electrode via the plurality of contact holes;
    forming a pixel-defining layer exposing a part of the pixel electrode and the cathode bus line; and
    forming a cathode electrode on the pixel-defining layer so as to contact the cathode bus line, the cathode electrode configured to operate as a common electrode.

15. The method of claim 14, wherein the pixel-defining layer covers the first auxiliary electrode and the second auxiliary electrode, and contacts the edge area of the cathode bus line.

16. The method of claim 14,
    wherein the pixel electrode and the cathode bus line comprise a transparent conductive metal oxide, and
    wherein the first auxiliary electrode and the second auxiliary electrode comprise at least one material selected from the group consisting of silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), molybdenum (Mo), titanium (Ti), tungsten (W), molybdenum tungsten (MoW), and copper (Cu).

17. The method of claim 14, wherein the first auxiliary electrode and the second auxiliary electrode comprise a material having a lower electrical resistance r than the cathode bus line.

18. The method of claim 14, wherein the cathode electrode does not contact the first auxiliary electrode and the second auxiliary electrode.

19. The method of claim 14, wherein the insulating layer comprises an inorganic insulating material.

20. The method of claim 14, wherein the pixel-defining layer comprises an organic insulating material.

* * * * *